United States Patent
Khoshgard et al.

(10) Patent No.: US 10,389,374 B1
(45) Date of Patent: Aug. 20, 2019

(54) OFFSET CALIBRATION OF ANALOG-TO-DIGITAL CONVERTERS USING A SPECTRUM ANALYZER

(71) Applicant: SiTune Corporation, San Jose, CA (US)

(72) Inventors: Mahdi Khoshgard, Los Gatos, CA (US); Marzieh Veyseh, Los Altos, CA (US); Vahid M Toosi, Los Altos, CA (US)

(73) Assignee: SiTune Corporation, San Jose, CA (US)

( * ) Notice: Subject to any disclaimer, the term of this patent is extended or adjusted under 35 U.S.C. 154(b) by 0 days.

(21) Appl. No.: 16/032,754

(22) Filed: Jul. 11, 2018

(51) Int. Cl.
| | |
|---|---|
| *H03M 1/10* | (2006.01) |
| *G01R 35/00* | (2006.01) |
| *G01R 23/16* | (2006.01) |
| *H03M 1/12* | (2006.01) |
| *H03M 1/06* | (2006.01) |

(52) U.S. Cl.
CPC .......... *H03M 1/1028* (2013.01); *G01R 23/16* (2013.01); *G01R 35/005* (2013.01); *H03M 1/1245* (2013.01); *H03M 1/06* (2013.01); *H03M 1/10* (2013.01); *H03M 1/12* (2013.01)

(58) Field of Classification Search
CPC ............ H03M 1/10; H03M 1/06; H03M 1/12; H03M 1/00
USPC .................. 341/120, 166, 110, 118, 155, 126
See application file for complete search history.

(56) References Cited

U.S. PATENT DOCUMENTS 9,264,059 B2 * 2/2016 Tousi .................. H03M 1/1038

\* cited by examiner

*Primary Examiner* — Joseph J Lauture
(74) *Attorney, Agent, or Firm* — Platinum Intellectual Property LLP

(57) ABSTRACT

Approaches provide for calibrating high speed analog-to-digital converters (ADCs). For example, a calibration signal can be applied to parallel ADCs. The output of the parallel ADCs can be analyzed using a gradient-based optimization approach or other such optimization approach to determine optimized gain error calibration data to compensate for gain mismatch in and between individual parallel time-interleaved ADCs and to determine time-offset calibration data to compensate for timing errors in and between individual parallel time-interleaved ADCs. For example, once a calibration signal is applied to an ADC, the output of the ADC can be analyzed to determine a spectrum of the calibration signal. One or more images (e.g., phasors) of the spectrum can be determined and used to determine initial values of the optimization. Thereafter, the optimization approach can be utilized to determine optimized gain error calibration data and optimized time-offset calibration data, which can be stored and/or used to calibrate individual time-interleaved ADCs.

18 Claims, 6 Drawing Sheets

OFFSET CALIBRATION OF ANALOG-TO-DIGITAL CONVERTERS USING A SPECTRUM ANALYZER

BACKGROUND

With high bandwidth applications (e.g., full band cable and satellite receivers, serial links and short range wireless communications) becoming more and more popular, there is increasing demand for high speed and high-performance analog-to-digital convertors (ADCs). An effective way to improve the throughput of an ADC is to place several ADCs that operate at a fraction of the total sample rate of the ADC in a time-interleaved architecture. However, it is a challenge to control and compensate mismatch (e.g., offset, gain, and timing) of the channel ADCs with the time-interleaved architecture.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure may overcome one or more of the aforementioned and other deficiencies experienced in conventional approaches to calibrating a high-speed analog-to-digital converter (ADC). In particular, various embodiments describe systems and methods for determining calibration data or other such optimization data for one or more ADCs (e.g., a set of time-interleaved ADCs) and updating an output digital signal from the ADC(s). Accordingly, the updated digital output signal is calibrated for gain mismatches and timing errors in and between individual ADCs of the set of time-interleaved ADCs.

For example, a calibration signal (e.g., a DC signal) can be applied to parallel ADCs. The output of the parallel ADCs can be analyzed to determine optimized gain error calibration data to compensate for gain mismatch in and between individual parallel time-interleaved ADCs and to determine time-offset calibration data to compensate for timing errors in and between individual parallel time-interleaved ADCs. For example, once a calibration signal is applied to an ADC, the output of the ADC can be analyzed by measuring the ADC output spectrum to determine the values of image phasors within the spectrum to be used in a gradient-based optimization approach or other such optimization approach. Thereafter, the gradient-based optimization approach can be utilized to determine optimized or otherwise updated gain error calibration data and optimized time-offset calibration data, which can be stored and/or used to calibrate individual time-interleaved ADCs.

In an implementation, the present disclosure is to a system including a signal generator, a switch, parallel analog-to-digital converters (ADCs), a gain correction component, a time-offset correction component, and a time-offset and gain estimator. The signal generator can be configured to provide a signal during a calibration mode. The parallel ADCs can provide ADC outputs (e.g., digital outputs) associated with the signal. The time-offset estimator and the gain error estimator can analyze the ADC output to determine values of image phasors within the spectrum to be used in a gradient-based optimization approach or other such optimization function, and optimized gain error calibration data and optimized time-offset calibration data, which can be stored in the memory and/or otherwise applied to the ADCs. Thereafter, the system incorporating these components and performing these features is, accordingly, calibrated.

Various other functions and advantages are described and suggested below as may be provided in accordance with the various embodiments.

Figure 1:
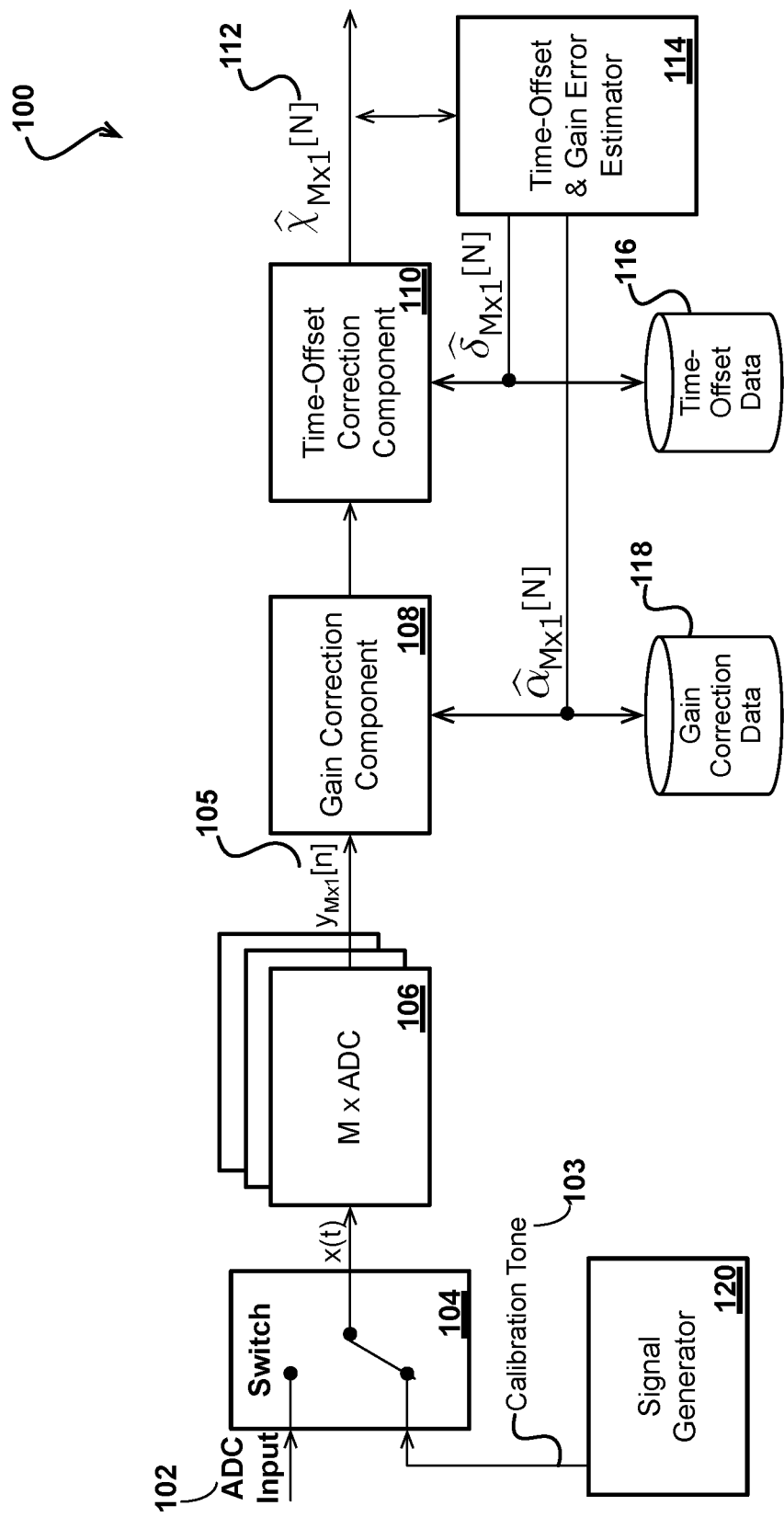
FIG. 1 illustrates a block diagram of a system for calibrating analog-to-digital converters (ADCs) in accordance with various embodiments.

FIG. 1 illustrates a block diagram of a system 100 to calibrate analog-to-digital converters (ADCs) in accordance with various embodiments. As described, there can be at least two types of mismatches in a set of time-interleaved ADCs. A first type of mismatch can include a mismatch between gain coefficients of the set of time-interleaved ADCs, where the gain mismatches can be deviations of the gains from the average gain of individual ADC channels. A second type of mismatch can include sampling errors of ADC channels of the set of time-interleaved ADCs. The sampling errors can be from timing mismatches between the set of time-interleaved ADCs channels and can be the deviations from linear-phase responses of the set of time-interleaved ADCs channels normalized by the frequency. In accordance with various embodiments, embodiments described herein minimize image power by finding an optimum mismatch image phasor using the image power gradient with respect to the mismatch image phasors.

As shown in FIG. 1, system 100 includes signal generator 120, switch 104, M parallel ADCs 106 (also referred to as a set of time-interleaved ADCs, ADCs, etc.), gain error correction component 108, time-offset correction component 110, and time-offset and gain error estimator 114. The system may include additional components in accordance with various embodiments described herein. In accordance with various embodiments, an ADC of the M parallel ADCs may also include one or more memory devices for storing instructions and data. As would be apparent to one of ordinary skill in the art, the one or more memory devices can include many types of memory, data storage, or computer-readable media, such as a data storage for program instructions for execution by the at least one processor and/or being used for storing data, a removable memory available for sharing information with other devices, and any number of computing approaches available for sharing with other processors. An example ADC may also include power components, such as conventional plug-in approaches, a battery operable to be recharged through conventional plug-in approaches, or through other approaches such as wireless (e.g., capacitive or inductive) charging through proximity with a power mat or other such device. Various other elements and/or combinations are possible as well within the scope of various embodiments.

When the switch is in a first position, ADC input signal 102 is provided to system 100. The switch can be in a first position during a normal operating mode and in a second position during a calibration mode. It should be understood that references to first and second position are merely for reference. A normal operating mode can include a mode where the system does not receive a calibration signal from signal generator 120. When the switch is in the second position, such as during the calibration mode, the switch isolates ADC input signal 102 and obtains calibration tone 103 from a tone source such as signal generator 120. In accordance with various embodiments, calibration tone 103 is also referred to as a calibration signal, a signal, or a tone. Switch 104 is illustrated for exemplary purposes as a single pole double throw switch, but it should be understood to a person of ordinary skill that other configurations of physical switches or semiconductor switches (e.g., transistors) are also applicable herein. In this example, calibration tone 103 from signal generator 120 is a signal of known frequency but with an unknown amplitude or phase. For example, the frequency can be associated with a determined, for example, predetermined, fundamental frequency.

As described, the system 100 includes a set of time-interleaved ADCs (e.g., parallel ADCs) 106 (illustrated as M×ADC, where M is a number of parallel ADCs). The set of time-interleaved ADCs 106 convert the received calibration tone 103 or ADC input signal 102, (i.e., x(t)), to digital signal 105, $y_{M \times 1}[n]$. The set of ADCs can be associated with an initial pre-determined value of gain error and an initial pre-determined value of time-offset. In an implementation, the set of time-interleaved ADCs 106 are time-interleaved high-speed ADCs. The set of time-interleaved ADCs 106 may consist of M parallel ADCs with the same input signal and different sampling clock sources and/or gain. In this example, the different clock sources have the same sampling clock frequency but different sampling clocks phases, for example.

In a calibration mode, time-offset and gain error estimator 114 is operable to determine optimized time-offset calibration data (e.g., $\hat{\delta}_{M \times 1}[n]$) and optimized gain error calibration data (e.g., $\hat{\alpha}_{M \times 1}[n]$). For example, during the calibration mode, switch 104 is in the second position. In this example, calibration tone 103 from signal generator 120 is received at the set of time-interleaved ADCs 106. The set of time-interleaved ADCs 106 convert calibration tone 103 to digital signal 105, $y_{M \times 1}[n]$. In the situation where gain error calibration data and time-offset data is not available, for example, during an initial calibration phase, digital signal 105 is received at time-offset and gain error estimator 114. Time-offset and gain error estimator 114 determines image power measurements of digital signal 105 based on the calibration tone, the initial pre-determined value of gain error and the initial pre-determined value of time-offset. For example, time-offset and gain error estimator 114 can determine a first set of image phasors and a set of mismatch image phasors based at least in part on digital signal 105. The image power measurements are analyzed to determine a total image power. The initial time-offset calibration data can be stored in data store 116 and the initial gain error calibration data can be stored in data store 118. As described, time-offset and gain error estimator 114 uses the image power measurements to determine time-offset calibration data and gain error calibration data to achieve a total image power that satisfies a threshold image power. In an embodiment, the threshold image power can be a lowest image power.

In the situation where the total image power does not satisfy the threshold image power, gain error correction component 108 and time-offset correction component 110 obtain updates from time-offset and gain error estimator 114 to optimize the time-offset calibration data and the gain error calibration data. For example, as described, digital signal 105 is obtained from the set of time-interleaved ADCs 106. Digital signal 105 is updated by gain error correction component 108 and time-offset correction component 110 using the most recent value of gain error calibration data from data store 118 and the most recent value of time-offset calibration data from data store 116, respectively, to generate output signal $\hat{X}_{M \times 1}[n]$ 112.

Time-offset and gain error estimator 114 determines optimized timing offset calibration data and optimized gain error calibration data based on output signal $\hat{X}_{M \times 1}[n]$ 112. Time-offset and gain error estimator 114 determines updated image power measurements of output signal 112. The updated image power measurements are analyzed to determine a new total image power and optimized time-offset calibration data and optimized gain error calibration data. The optimized time-offset calibration data can be stored in data store 116 and the optimized gain error calibration data can be stored in data store 118.

In accordance with various embodiments, the process continues in an iterative feedback loop, whereby the process repeats to minimize the total image power. This can include, for example, repeating the process until a determined total image power is met, until a change in total image power from one iteration to a next iteration satisfies a threshold change amount of total image power, or until some other criteria is satisfied.

After the calibration phase, the switch is configured in a standard operating mode. For example, the switch in connected to receive ADC input signal 102. In this mode, time-offset and gain error estimator 114 is disabled and gain error correction component 108 and time-offset correction component use the optimized time-offset calibration data from data store 116 and the optimized gain error calibration data from data store 118. For example, gain error correction component 108 obtains the most recent updated optimized gain error calibration data from data store 118 and adjusts the gain errors between the set of time-interleaved ADCs 106. Time-offset correction component 110 obtains the most recent updated optimized time-offset calibration data from data store 116 and adjusts time-offset delay errors between the set of time-interleaved ADCs 106.

Figure 2A:
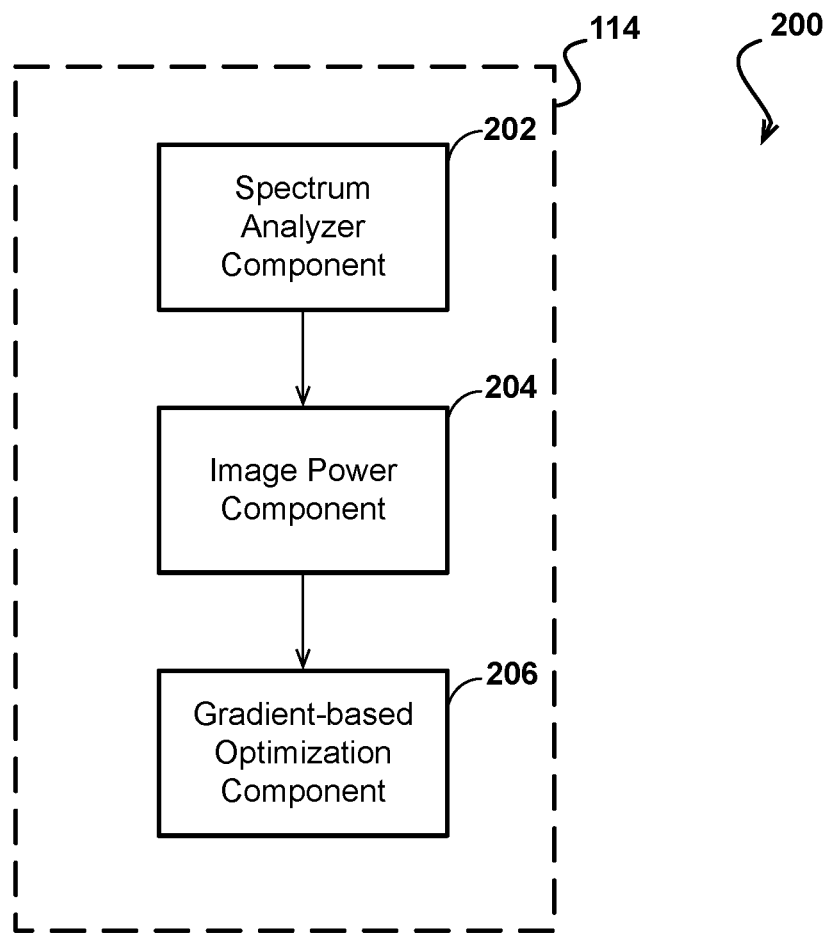
FIGS. 2A and 2B illustrate an optimization approach to determine optimized gain error calibration data and optimized time-offset calibration data in accordance with various embodiments.

FIG. 2A illustrates a block diagram 200 of additional components of time-offset and gain error estimator 114 to determine optimized gain error calibration data and optimized time-offset calibration data in accordance with various embodiments. In this example, time-offset and gain error estimator 114 is illustrated as including spectrum analyzer component 202, image power component 204, and gradient-based optimization component 206. Spectrum analyzer component 202 is operable to measure a power spectral density (e.g., image power components) of an output signal, for example, digital signal 105 or 112 of an ADC illustrated in FIG. 1, during a calibration phase. In accordance with various embodiments, spectrum analyzer component 202 is active when the system operates in the calibration mode and is disabled or otherwise not active when the system is not in the calibration mode.

Image power component 204 is operable to extract or otherwise identify image power components (e.g., image components 222 shown in FIG. 2B) from power spectral density or image spectrum 220 (i.e., the spectrum analyzer output). Image power component 204 can determine the values of individual image components and integrate individual image power component power to determine a total image power. For example, image power component 204 can determine image power measurements based on the calibration tone, initial pre-determined value of gain error and initial pre-determined value of time-offset of the set of time-interleaved ADCs. This can include, for example, determining image phasors and mismatch image phasors, where a mismatch phasor is associated with gain error and time offset error and an FFT of the image mismatch phasor corresponds to an image phasor. An integral of power of image phasors can correspond to the total image power. In accordance with various embodiments, the frequency of the calibration tone is known, thus the frequency of individual image components is known. In accordance with various embodiments, image power component 204, operates in an active state (e.g., a first state) or an inactive state (e.g., a second state). Image power component 204 can operate in the active state when the system is in the calibration mode and in the inactive state otherwise.

Gradient-based optimization component 206 is operable to optimize the time-offset calibration data and the gain error calibration data based on a gradient (see equations 5 and 6) of the total image power along time offset and gain correction. In an embodiment, the optimal values minimize a total image power (i.e., a total power of image components 222). In accordance with various embodiments, gradient-based optimization component 206 operates in an active state (e.g., a first state) or an inactive state (e.g., a second state). Gradient-based optimization component 206 is active when the system operates in the calibration mode and is disabled or otherwise not active when the system is not in the calibration mode.

Figure 2B:
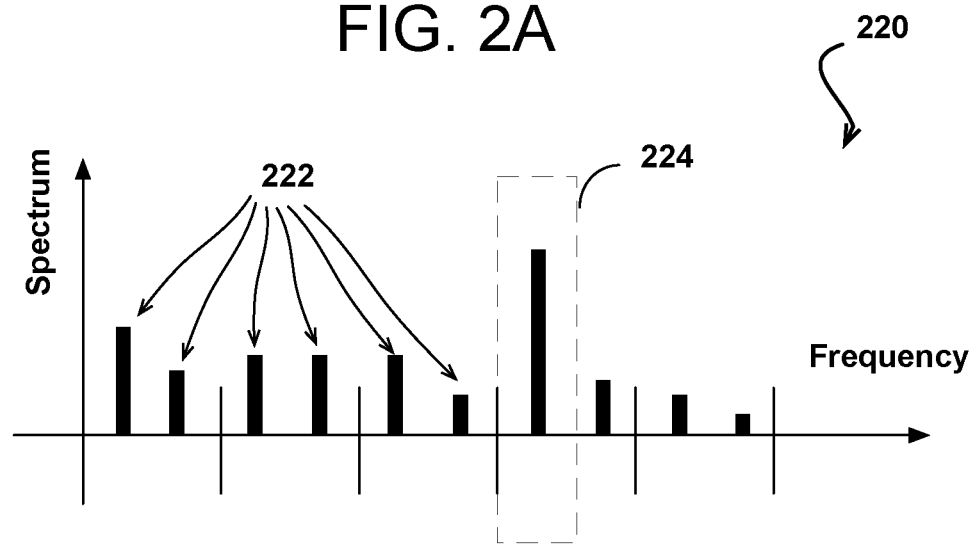

FIG. 2B illustrates example image spectrum 220 of a set of time-interleaved ADCs' (e.g., 106) output in accordance with various embodiments. As shown in FIG. 2B, the spectrum includes main component 224 and individual image components 222. In this example, a frequency of a calibration tone generated during the calibration mode is known. In this situation, because the frequency of the calibration tone is known, a location of main component 224 of image spectrum 220 is known, as well as locations of individual image components 222 caused by gain error and time-offset errors of set of time-interleaved ADCs. For example, assuming the set of time-interleaved ADCs 106 samples an input signal with a frequency of $f_s$, each ADC channel can sample an input signal at a rate of $f_s/M$ causing the input spectrum in a frequency domain to be repeated periodically at intervals of $f_s/M$. If the M ADC channels are perfectly matched, the periodic repetition cancel each other, except at integer multiple of $f_s$. However, channel mismatches between the M ADC channels are inherent in a circuit. The downscaling of an integrated circuit even complicates the matching of components in the M ADC channels. The error behavior of mismatches among the M ADC channels can distort the output signal of a time-interleaved ADC and reduce the system performance significantly.

In accordance with various embodiments, a relationship between individual image components 222 (also referred to as image phasors) in image spectrum 220 and the value of time-offset error $\hat{\delta}_{M \times 1}[n]$ and gain errors $\hat{\alpha}_{M \times 1}[n]$ can be represented as:

$$I_K = \frac{1}{M} \sum_{m=0}^{M-1} (\alpha_m \cdot e^{-j2\pi q \delta_m}) \cdot (e^{-j2\pi \frac{m}{M} K}), \quad \text{Eq (1)}$$

$$K = 0, 1, \ldots, M-1$$

where $I_K$ is the Kth image phasor of the signal for K=1 to M, $I_0$ is the main component of the signal, and q is the frequency of the calibration signal divided by ADC sampling rate. Eq (1) can be represented as M-point FFT as:

$$I_K = \text{FFT}\{\alpha_m \cdot e^{-j2\pi q \delta_m}\} \quad \text{Eq (2)}$$

The mismatch phasor, $\alpha_m \cdot e^{-j2\pi q \delta_m}$, which represents the gain error ($\alpha_m$) and phase error ($\delta_m$) can be extracted directly from the image phasor and can be represented as:

$$\alpha_m \cdot e^{-j2\pi q \delta_m} = \text{IFFT}\{I_K\} \quad \text{Eq (3)}$$

Total image power, J, can be calculated based on Eq (1) and E(q) 2 as follows:

$$J = \sum_{K=1}^{M-1} |I_K|^2 = \left(\sum_{K=0}^{M-1} |I_K|^2\right) - |I_0|^2 \quad \text{Eq (4)}$$

Gradient-based optimization component 206 can operate using the gradient function of J over the time-offset error $\hat{\delta}_{M \times 1}[n]$ values and the gain errors $\hat{\alpha}_{M \times 1}[n]$ values. In accordance with various embodiments, the gradient of total image power J over time-offset error $\hat{\delta}_{M \times 1}[n]$ values and gain errors $\hat{\alpha}_{M \times 1}[n]$ values can be represented as:

$$\frac{\partial J}{\partial \delta_m} = \quad \text{Eq (5)}$$

$$-\frac{4\pi q}{M^2} \alpha_m \sum_{l=0}^{M-1} \alpha_l \cdot \sin(2\pi q(\delta_m - \delta_l)) \cong -2\frac{(2\pi q)^2}{M} \cdot \left(\delta_m - \frac{1}{M}\sum_{l=0}^{M-1} \delta_l\right)$$

$$\frac{\partial J}{\partial \alpha_m} = \left(\frac{2}{M}\alpha_m\right) - \frac{2}{M^2} \sum_{l=0}^{M-1} (\alpha_l \cdot \cos(2\pi q(\alpha_m - \alpha_l))) \cong \quad \text{Eq (6)}$$

$$-\frac{2}{M} \cdot \left(\alpha_m - \frac{1}{M}\sum_{l=0}^{M-1} \alpha_l\right)$$

Figure 3:
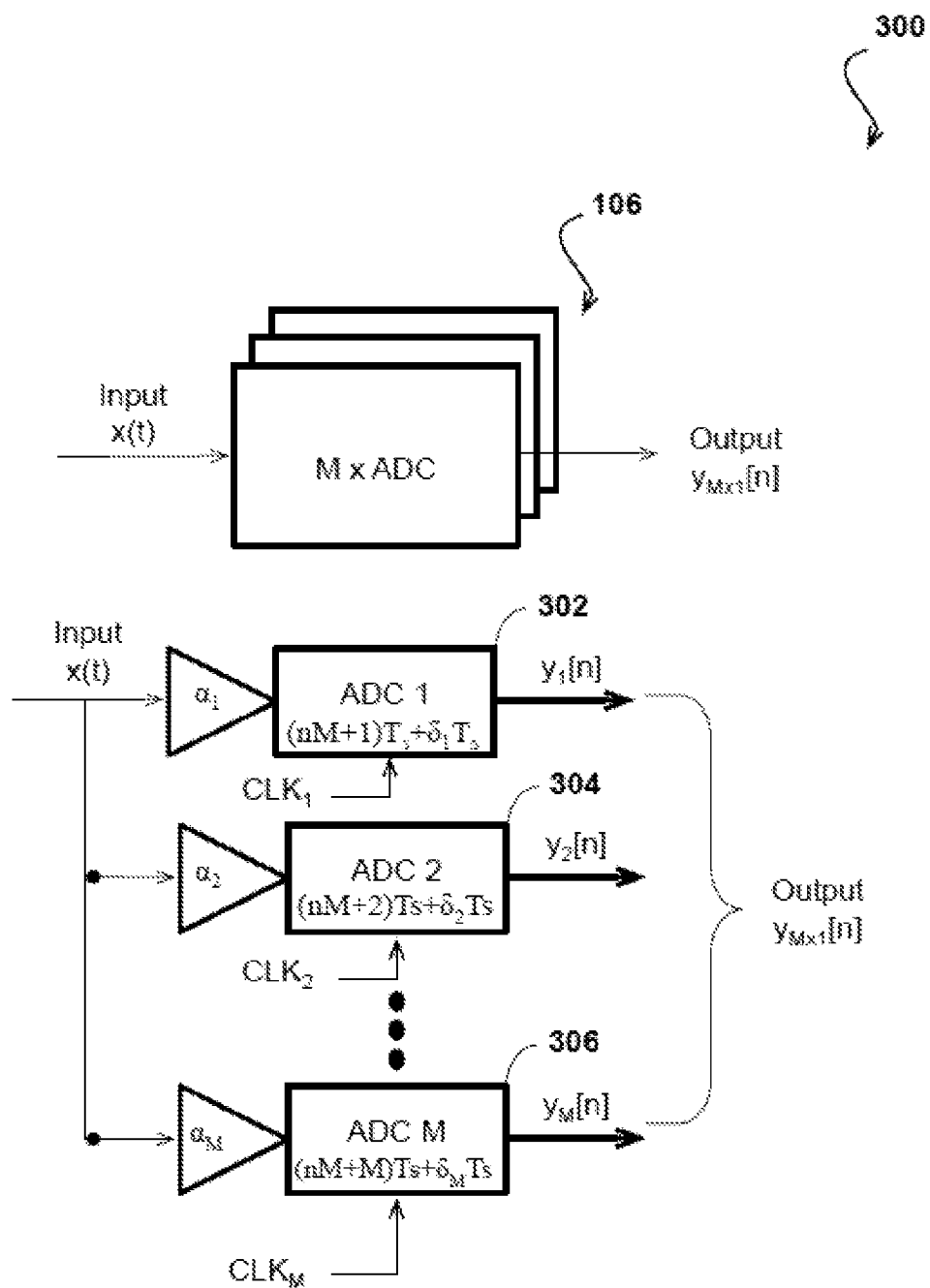
FIG. 3 illustrates a block diagram of a system to determine calibration data (e.g., gain error calibration data and time-offset calibration data) in accordance with various embodiments.

FIG. 3 illustrates example block diagram 300 of a system to determine initial calibration data in accordance with various embodiments. As shown in FIG. 3, the set of time-interleaved ADCs 106 can include time-interleaved high-speed ADCs 302, 304, and 306. In this example, ADCs 106 may consist of M parallel ADCs with the same input signal but different sampling clock sources. These different clock sources have the same sampling clock frequency but different sampling clocks phases, for example. In a further example, when M is the number of parallel ADCs and assuming $T_S$ as sampling clock of each ADC, then sampling times are:

$$\text{ADC\#1: CLK}_1 = (nM+1)T_S + \delta_1 T_S \quad \text{Eq (7)}$$

$$\text{ADC\#2: CLK}_2 = (nM+2)T_S + \delta_2 T_S \quad \text{Eq (8)}$$

. . .

$$\text{ADC\#M: CLK}_M = (nM+M)T_S + \delta_M T_S \quad \text{Eq (9)}$$

Each of ADCs, marked in FIG. 3 as ADC #1, ADC #2, . . . ADC #M, receive the X(t) ADC input as well as clocks CLK1, CLK2, ... CLKM. FIG. 3 also illustrates that the function in the ADCs are =((nM+1)$T_S$+$\delta_1$) $T_S$, ((nM+2) $T_S$+$\delta_2$) $T_S$ ... ((nM+M)$T_S$+$\delta_M$)$T_S$. The sampled signal provided at output $y_{M \times 1}[n]$ can be represented as: $\alpha_M \cdot x((nM+1+\delta_M) \cdot T_S$ $$y_{Mx1}[n] \triangleq \begin{pmatrix} y1[n] \\ y2[n] \\ y3[n] \\ \vdots \\ yM[n] \end{pmatrix} \triangleq \begin{pmatrix} \alpha 1 \cdot x((nM+1+\delta 1) \cdot Ts \\ \alpha 2 \cdot x((nM+2+\delta 2) \cdot Ts \\ \alpha 3 \cdot x((nM+3+\delta 3) \cdot Ts \\ \vdots \\ \alpha M \cdot x((nM+M+\delta M) \cdot Ts \end{pmatrix} \quad \text{Eq (10)}$$

As described, the set of time-interleaved ADCs 106 convert X(t) to a digital signal, $y_{M \times 1}[n]$. A time-offset and gain error estimator or other such component determines image power measurements of digital signal X(t). The image power measurements are analyzed to determine a total image power and initial time-offset calibration data and initial gain error calibration data. The initial time-offset calibration data and the initial gain error calibration data can be stored and/or utilized to determine time-offset calibration data and gain error calibration data that minimize a total image power or allow for a total image power that satisfies a threshold image power.

Figure 4:
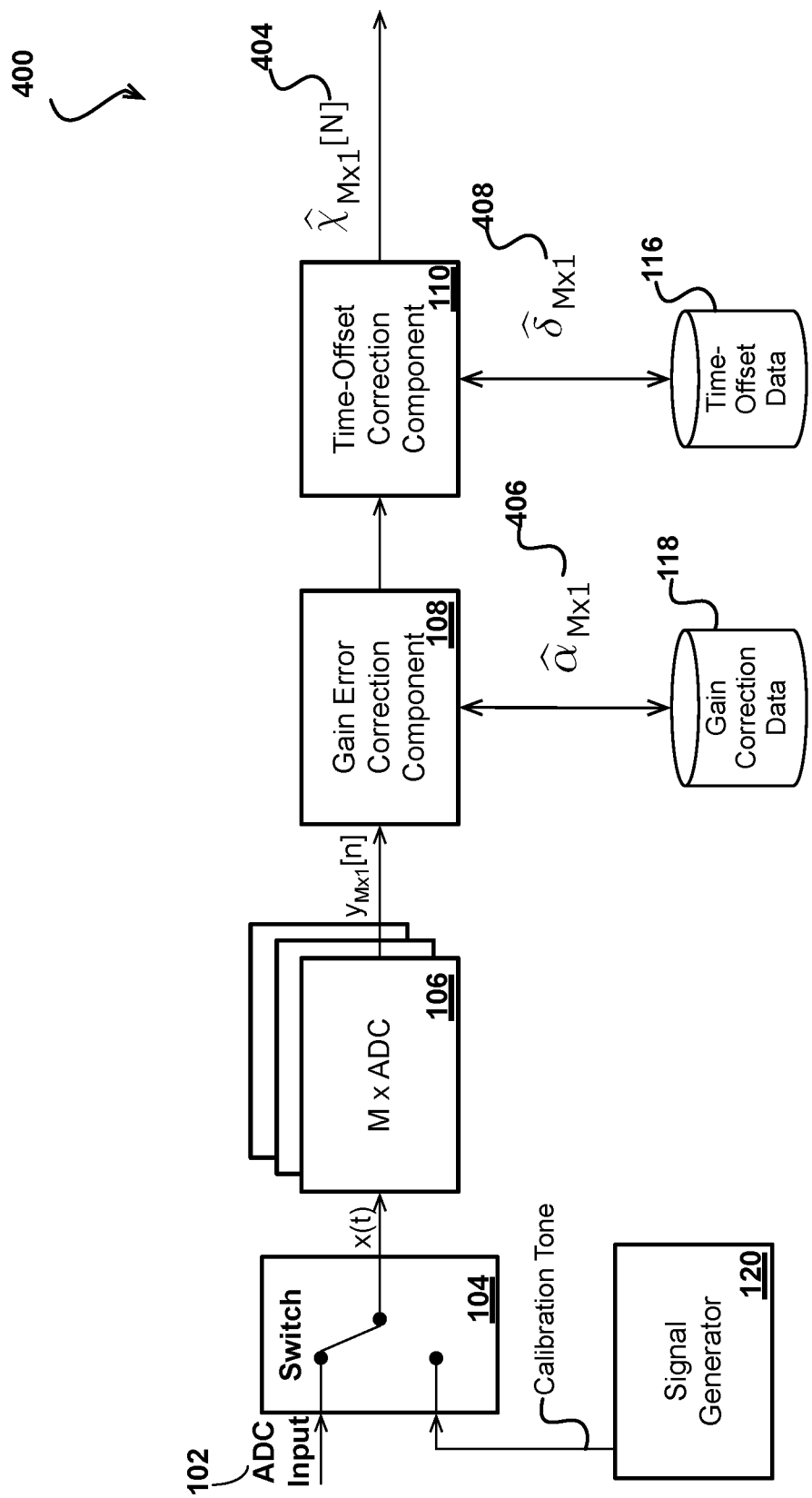
FIG. 4 illustrates a block diagram of a system to calibrate a system of analog-to-digital converters in accordance with various embodiments.

FIG. 4 illustrates a block diagram of system 400 to calibrate one or more ADCs in accordance with various embodiments. In this example, during an operating mode, ADC input signal 102 is provided via a source to system 400, in an implementation. As described, optimized gain error calibration data and optimized time-offset calibration data can be utilized to calibrate one or more ADCs. For example, ADC input signals with error $Y_{M \times 1}[n]$ are subjected to removal of the estimated time offset and gain error by applying optimized time-offset calibration data 408 from data store 116 by time-offset correction component 110 and optimized gain error calibration data 406 from data store 118 by gain error correction component 108, resulting in a corrected output signal 404. For example, gain error correction component 108 is operable to apply optimized gain error calibration data 406 from data store 118 which was stored during the calibration phase. During the normal operational mode, which is after the calibration mode, the value of gain error calibration data does not change. During the calibration mode, the value of gain error calibration data is updated by a time-offset and gain error estimator (not shown). Time-offset correction component 110 is operable to apply optimized time-offset calibration data 408 stored in data store 116 which was stored during the calibration phase. During the normal operational mode, which is after the calibration mode, the value of the time-offset calibration data stored in data store 116 is not updated. During the calibration mode, the value of the time-offset correction data is updated by a time-offset and gain error estimator (not shown).

Figure 5:
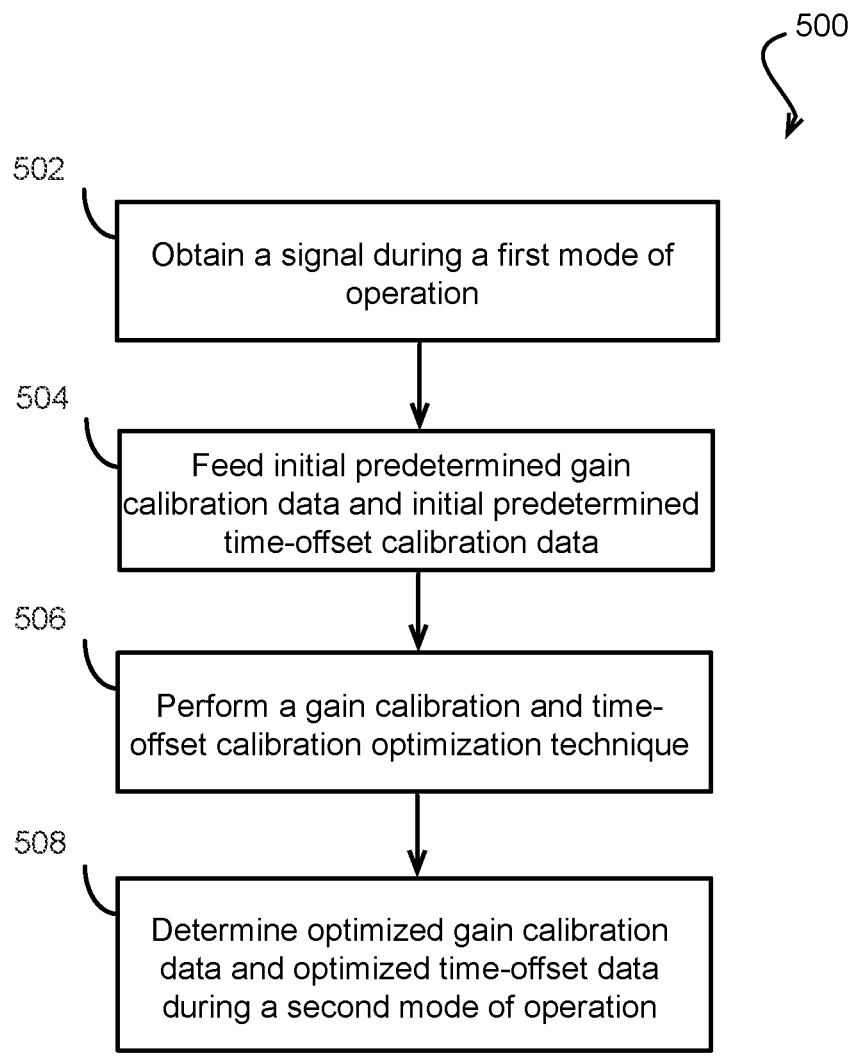
FIG. 5 illustrates an example process for calibrating a system of analog-to-digital converters in accordance with various embodiments.

FIG. 5 illustrates an example process 500 for calibrating a system of analog-to-digital converters in accordance with various embodiments. It should be understood that, for any process described herein, that there can be additional or fewer steps performed in similar or alternative orders, or in parallel, within the scope of the various embodiments unless otherwise stated. In this example, a signal is obtained 502 at a set of analog-to-digital converts (ADCs) during a first mode of operation. The signal can be a calibration signal and the set of time-interleaved ADCs can be time-interleaved high-speed ADCs. The first mode of operation can correspond to a calibration operating mode. Initial predetermined gain error calibration data and initial predetermined time-offset calibration data are feed 504 or otherwise received or obtained by the set of ADCs. Using the initial predetermined gain error calibration data and the initial predetermined time-offset calibration data, gain-error estimation and time-offset estimation is performed 506 to determine 508 optimized gain error calibration data and optimized time-offset calibration data during a second mode of operation (e.g., a normal operating mode). For example, first output is analyzed to determine image power measurements. The image power measurements are analyzed to determine a total image power. The total image power is compared to a threshold image power. In the situation where the total image power does not satisfy the threshold image power, the initial gain error calibration data and the initial time-offset calibration data are optimized until the total image power satisfies the threshold image power.

Figure 6:
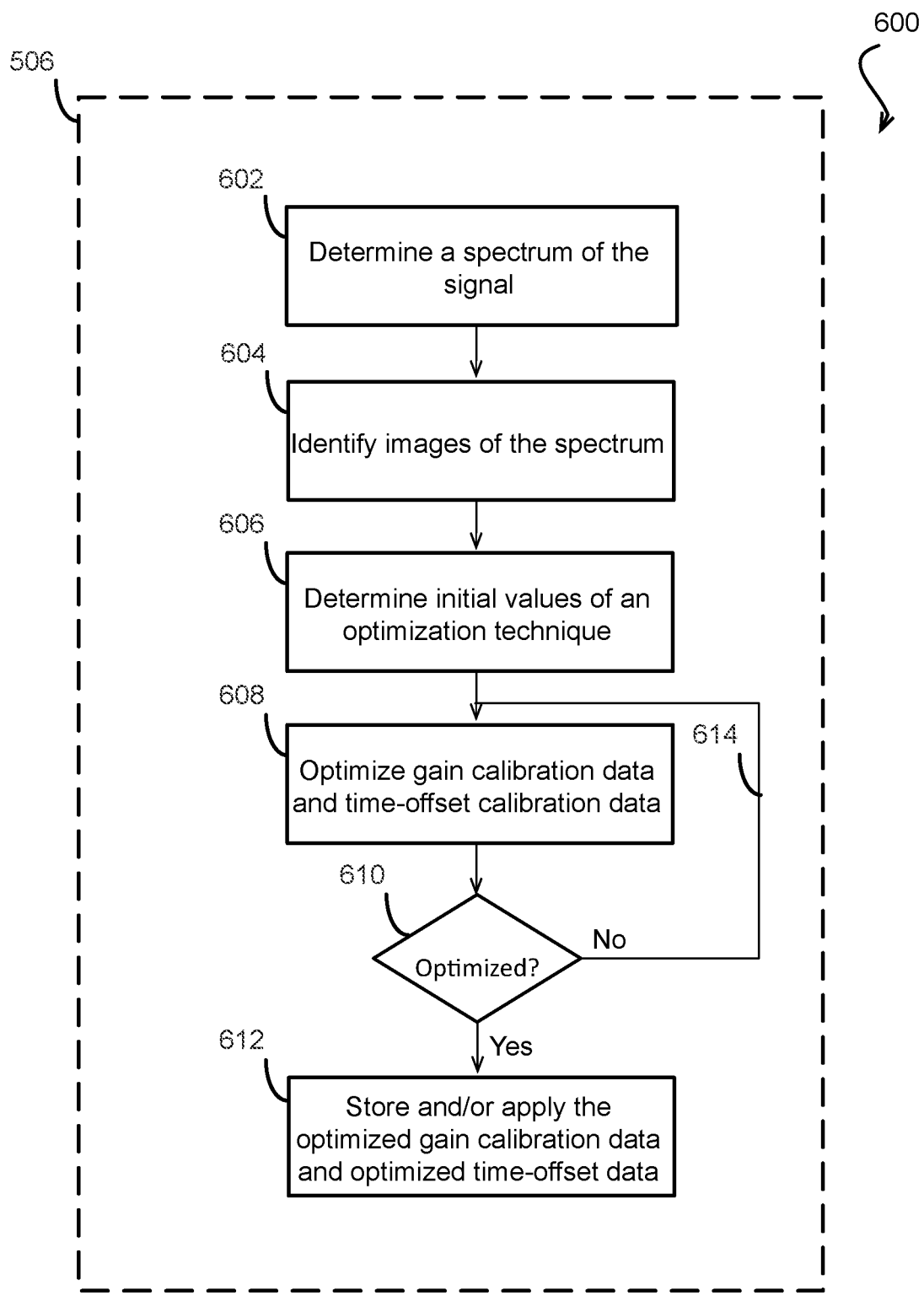
FIG. 6 illustrates an example process for determining optimization data in accordance with various embodiments.

For example, FIG. 6 illustrates an example process 600 for optimizing gain error calibration data and time-offset calibration data in accordance with various embodiments. In this example, a spectrum of the signal is determined 602. Images of the spectrum are identified 604. Initial values of a gradient-based optimization technique or other such cost function are determined 606. The gradient-based optimization technique attempts to optimize 608 gain error calibration data and time-offset calibration data. During an iteration of such determination, a determination 610 is made whether the gain error calibration data and the time-offset calibration data are sufficiently optimized. For example, an output of a set of ADCs is analyzed to determine whether a total component power of the output is minimized based at least on the gain error calibration data and the time-offset calibration data. In the situation where it is determined that the calibration data is sufficiently optimized, optimized gain error calibration data and optimized time-offset calibration data is stored 612 and/or otherwise applied to output signals of one or more ADCs of a set of ADCs. In the situation where it is determined that the calibration data is not sufficiently optimized, the process iterates 614 until a stop instruction is received and/or the calibration data is sufficiently optimized.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to filter tones from a mixed signal using novel integrated circuits in a communications network.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random-access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected to, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used, and/or elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computing system, comprising:
a computing device processor;
a memory device including instructions that, when executed by the computing device processor, enables the computing system to:
  receive a calibration tone to a set of analog-to-digital converters (ADCs), the set of ADCs associated with an initial pre-determined value of gain error and an initial pre-determined value of time-offset;
  determine an ADC output spectrum based at least in part on the calibration tone, the initial pre-determined value of gain error, and the initial pre-determined value of time-offset;
  determine a first set of image phasors and a set of mismatch image phasors based at least in part on the ADC output spectrum;
  determine a first image power based at least in part on the first set of image phasors;
  determine the first image power does not satisfy an image power threshold;
  determine gain error calibration data and time-offset calibration data based at least in part on image power gradients with respect to the set of mismatch image phasors;
  apply the gain error calibration data and the time-offset calibration data to determine a second set of image phasors;
  determine second image power measurements based at least in part on a second set of image phasors; and
  apply the gain error calibration data and the time-offset calibration data to an output of the ADCs based at least in part on whether the second image power measurements satisfy the image power threshold.

2. The computing system of claim 1, wherein the instructions, when executed by the computing device processor, further enables the computing system to:
determine the second image power measurements fail to satisfy the image power threshold; and
determine updated gain error calibration data and updated time-offset calibration data based at least in part on image power gradients with respect to mismatch sets of image phasors, wherein gain error and time-offset determination iterates until respective image power measurements satisfy the image power threshold.

3. The computing system of claim 1, wherein the instructions, when executed by the computing device processor, further enables the computing system to:
determine the second image power measurements satisfy the image power threshold;
receive analog inputs to the set of ADCs; and
apply the gain error calibration data and the time-offset calibration data to an output of the ADCs.

4. The computing system of claim 1, further comprising:
a signal generator configured to generate at least the calibration tone;
a switch configured to operate in at least one of a first position and a second position, wherein the switch, when operating in the first position, is configured to couple an input source with a set of ADCs, and wherein the switch, when operating in the second position, is configured to couple the signal generator with the set of ADCs;
a gain correction component configured to apply the gain error calibration data;
a time-offset correction component configured to apply the time-offset calibration data; and a time-offset and gain estimator configured to determine one of the gain error calibration data or the time-offset calibration data.

5. The computing system of claim 4, wherein the time-offset and gain estimator further includes:
   a spectrum analyzer component configured to determine the ADC output spectrum;
   an image power component configured to determine a total image power of at least the first set of image phasors; and
   a gradient-based optimization component configured to optimize the gain error calibration data and time-offset calibration data based at least in part on an image power gradient with respect to a corresponding set of mismatch image phasors.

6. A computer-implemented method, comprising:
   obtaining a signal during a first mode;
   providing initial gain error calibration data and initial time-offset calibration data;
   using a gradient-based optimization technique to determine optimized gain error calibration data and optimized time-offset calibration data based at least in part on the initial gain error calibration data, the initial time-offset calibration data, and the signal; and
   applying the optimized gain error calibration data and the optimized time-offset calibration data during a second mode.

7. The computer-implemented method of claim 6, further comprising:
   using a signal generator to generate the signal, the signal associated with at least one characteristic, the at least one characteristic including a determined fundamental frequency.

8. The computer-implemented method of claim 6, further comprising:
   using a switch to operate in at least one of a first position in a calibration mode or a second position in a normal mode, the first mode corresponding to the calibration mode, the second mode corresponding to the normal mode, wherein the switch, when operating in the first position, is configured to couple an input source with a set of time-interleaved ADCs, and wherein the switch, when operating in the second position, is configured to couple a signal generator with the set of time-interleaved ADCs.

9. The computer-implemented method of claim 6, wherein using the gradient-based optimization technique includes:
   determining whether a value of a total image power satisfies an image power threshold; and
   iteratively adjusting gain error calibration data and time-offset calibration data based at least in part on the value of the total image power when the value of the total image power fails to satisfy the image power threshold.

10. The computer-implemented method of claim 6, further comprising:
    receiving the signal at a set of analog-to-digital converters (ADCs); and
    generating a digital signal, the initial gain error calibration data, the initial time-offset calibration data, and a value of a total image power based at least in part on the digital signal.

11. The computer-implemented method of claim 6 further comprising:
    using a spectrum analyzer component to determine a power spectral density of a digital signal, the power spectral density including one or more image components and a main component.

12. The computer-implemented method of claim 11, further comprising:
    using an image power component to determine a total image power of a set of image power components of the power spectral density.

13. The computer-implemented method of claim 12, further comprising:
    using a gradient-based optimization component to optimize gain error calibration data and time-offset calibration data based at least in part on a gradient of the total image power.

14. A computing system, comprising:
    a signal generator configured to generate a calibration tone;
    a switch configured to operate in at least one of a first position and a second position, wherein the switch, when operating in the first position, is configured to couple an input source with a set of time-interleaved ADCs, and wherein the switch, when operating in the second position, is configured to couple the signal generator with the set of time-interleaved ADCs;
    a set of time-interleaved ADCs that include a number of parallel ADCs, the set of time-interleaved ADCs associated with an initial pre-determined value of gain error and an initial pre-determined value of time-offset;
    a spectrum analyzer component configured to determine an output spectrum of the set of time-interleaved ADCs based at least in part on calibration tone, the initial pre-determined value of gain error, and the initial pre-determined value of time-offset when the switch is operating in the first position;
    an image power component configured to determine total image power and mismatch image phasors based at least in part on the output spectrum;
    a time-offset and gain estimator configured to use the mismatch image phasors to determine one gain error calibration data and time-offset calibration data;
    a gradient-based optimization component configured to optimize the gain error calibration data and the time-offset calibration data based at least in part on a gradient of the total image power;
    a gain correction component configured to apply gain error calibration data; and
    a time-offset correction component configured to apply time-offset calibration data.

15. The computing system of claim 14, wherein the time-offset and gain estimator are further configured to:
    determine a total image power of a set of image power components of the output spectrum;
    determine whether a value of a total image power satisfies an image power threshold; and
    iteratively adjust gain error calibration data and time-offset calibration data based at least in part on the value of the total image power when the value of the total image power fails to satisfy the image power threshold.

16. The computing system of claim 14, further comprising:
    a computing device processor;
    a memory device including instructions that, when executed by the computing device processor, further enables the computing system to:
    use the time-offset and gain estimator to determine optimized gain calibration data and optimized time-offset calibration data during a first mode of operation; and use the gain correction component and the time-offset correction component to apply the optimized gain calibration data and the optimized time-offset calibration data to an output of a set of time-interleaved ADCs during a second mode of operation.

17. The computing system of claim 16, wherein the instructions, when executed by the computing device processor, further enables the computing system to:

iteratively adjust gain error calibration data and time-offset calibration data until at least one threshold is satisfied.

18. The computing system of claim 14, wherein the calibration tone is a predetermined signal, the predetermined signal associated with a predetermined fundamental frequency.

* * * * *